(12) United States Patent
Thakore et al.

(10) Patent No.: US 9,547,550 B1
(45) Date of Patent: Jan. 17, 2017

(54) SYSTEM AND METHOD FOR IMPROVED DATA MAINTENANCE IN A FLASH DRIVE

(71) Applicant: Tidal Systems, Inc., Santa Clara, CA (US)

(72) Inventors: Priyanka Thakore, San Jose, CA (US); Meng Kun Lee, Cupertino, CA (US)

(73) Assignee: Tidal Systems, Inc., Santa Clara, CA (US)

( * ) Notice: Subject to any disclaimer, the term of this patent is extended or adjusted under 35 U.S.C. 154(b) by 6 days.

(21) Appl. No.: 14/793,376

(22) Filed: Jul. 7, 2015

(51) Int. Cl.
   *G06F 11/00* (2006.01)
   *G06F 11/10* (2006.01)
   *G11C 29/52* (2006.01)
   *G06F 12/02* (2006.01)

(52) U.S. Cl.
   CPC ......... *G06F 11/1016* (2013.01); *G06F 11/108* (2013.01); *G06F 11/1072* (2013.01); *G06F 12/0246* (2013.01); *G06F 12/0253* (2013.01); *G11C 29/52* (2013.01); *G06F 2212/7201* (2013.01); *G06F 2212/7205* (2013.01)

(58) Field of Classification Search
   USPC ....................................... 714/6.24
   See application file for complete search history.

(56) References Cited

U.S. PATENT DOCUMENTS

| | | | | |
|---|---|---|---|---|
| 7,082,557 B2* | 7/2006 | Schauer | .................. | H04L 12/42 370/224 |
| 2009/0313453 A1* | 12/2009 | Stefanus | .............. | G06F 11/1441 711/210 |
| 2011/0219261 A1* | 9/2011 | Bartlett | ............... | G06F 11/2082 714/6.23 |
| 2013/0179733 A1* | 7/2013 | Frank | .................... | G06F 11/261 714/29 |
| 2015/0355960 A1* | 12/2015 | Volvovski | ........... | G06F 11/0775 714/54 |

* cited by examiner

*Primary Examiner* — Sarai Butler
(74) *Attorney, Agent, or Firm* — Brooks, Cameron & Huebsch, PLLC

(57) ABSTRACT

Systems and method provide for the writing of a data block and corresponding metadata block to a storage location. Metadata and data block are encoded separately. The metadata and data block may be moved to a different location due to garbage collection, defragmentation, or some other prompt. The metadata is decoded, modified, re-encoded and written to the different location whereas the data block can be written to the new location without re-encoding.

20 Claims, 4 Drawing Sheets

SYSTEM AND METHOD FOR IMPROVED DATA MAINTENANCE IN A FLASH DRIVE

BACKGROUND

1. Field of the Invention

This invention relates to systems and methods for storing and accessing data in a flash memory system.

2. Background of the Invention

Solid-state drives, also referred to as SSDs, are data storage devices that make use of nand flash memory devices as storage elements. Typically they have a SSD controller that accepts host commands on one end and communicate to the nand flash on the other. Nand flash is a type of non-volatile storage device that retains data when powered off. The SSD controller accesses the nand flash device through the nand interface.

The page is the smallest memory operation unit, i.e. a program or read operation is performed on a page. Typical nand page sizes are ~4 KByte, ~8 KByte, and ~16 KByte. The page sizes may be slightly larger than 4 KByte, 8 KByte, or 16 KByte to accommodate the data ECC parity. The typical nand interface data rates can be 200 MBps to 400 MBps. For a read, the memory read time will be ~60 μs and data transfer out would be ~40 μs for ~16 KB data, ~20 μs for 8 KB data and ~10 μs for 4 KB.

Logical block addressing (LBA) is a common scheme used for specifying the location of blocks of data stored on computer storage devices, generally systems such as hard drives and SSDs. Typical host LBA granularity is 512 bytes. The SSD controller can choose to operate on 4 KBytes and manages the mapping between the 512 byte host LBA number and the 4 KByte controller LBA number. Each LBA in the system needs to be mapped to unique data units. The size of this data unit defines how large the physical address pointer is. As a result the size of the LBA pointer would be a function of the number of dies, number of blocks, number of pages and size of data unit, depending on the size of the data unit in the page.

The apparatus and methods disclosed herein provide an improved apparatus and method for storing, accessing, and maintaining data blocks, such as LBAs in a nand flash device or other storage devices.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
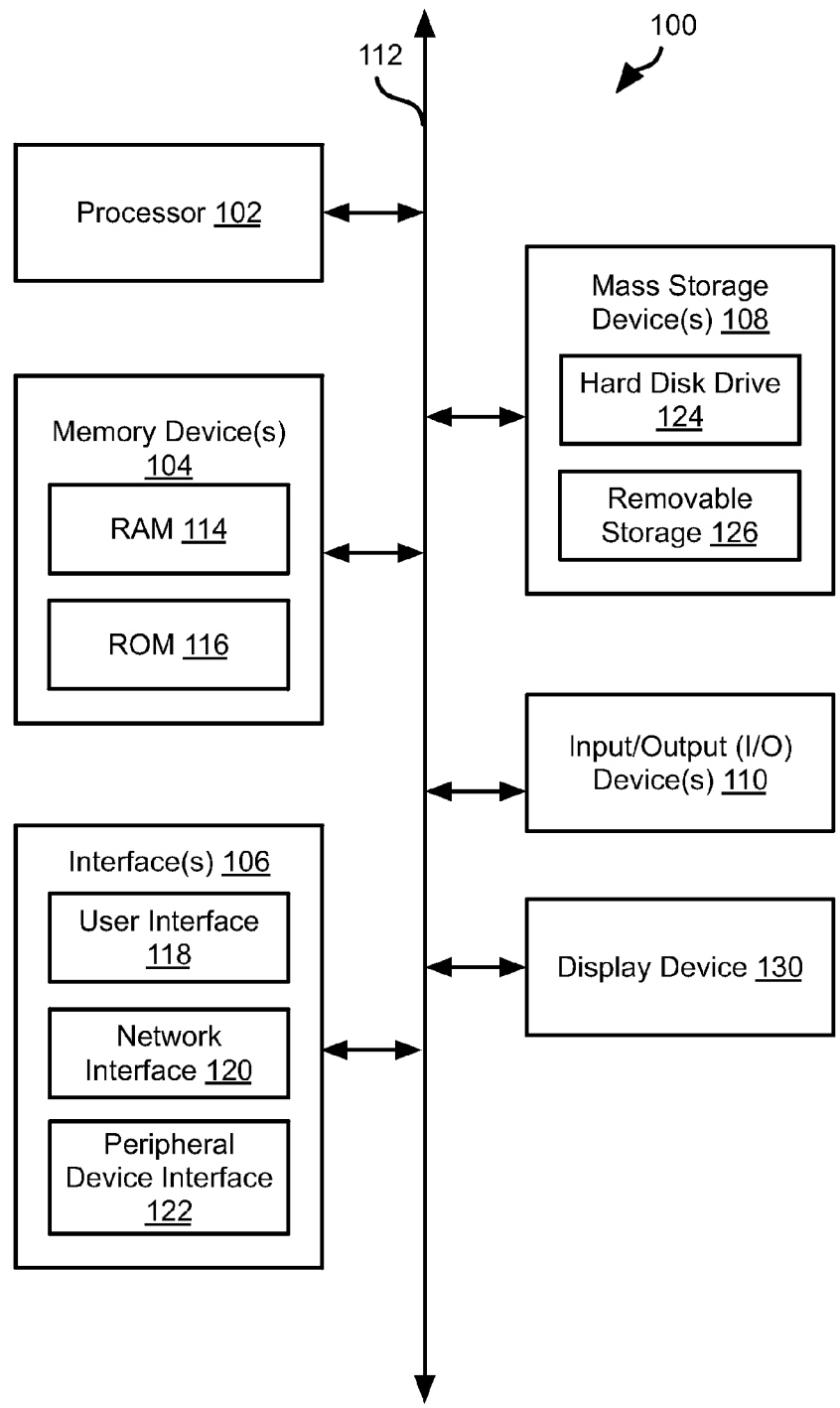
FIG. 1 is a schematic block diagram of a computing system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods for storing and accessing compressed data in a flash memory as described below.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various monitoring functions as discussed herein, and can execute one or more application programs, such as the application programs described herein. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

memory device(s) 104 include various computer-readable media, such as volatile memory (e.g., random access memory (RAM) 114) and/or nonvolatile memory (e.g., read-only memory (ROM) 116). memory device(s) 104 may also include rewritable ROM, such as flash memory.

Mass storage device(s) 108 include various computer readable media, such as magnetic tapes, magnetic disks, optical disks, solid-state memory (e.g., flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
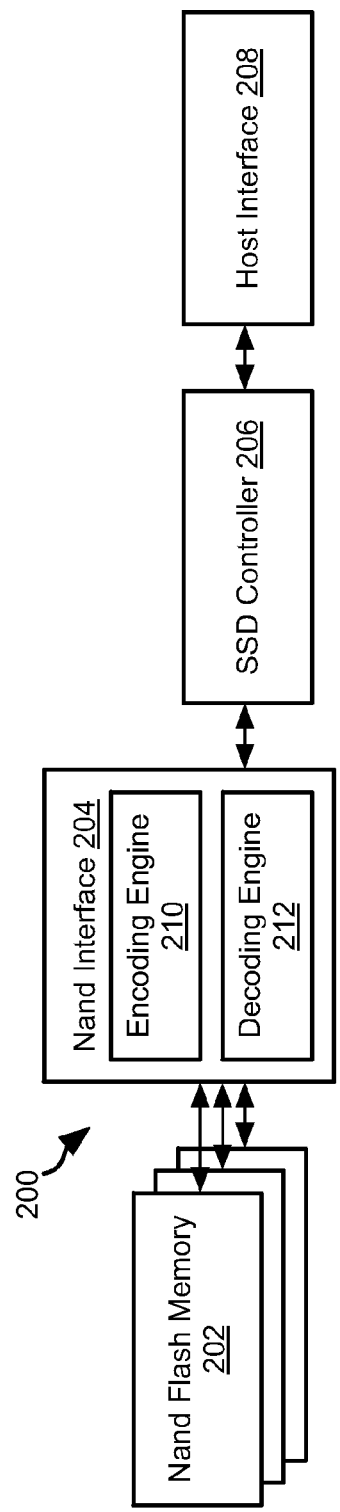
FIG. 2 is a schematic block diagram of a components of a storage system in accordance with the prior art.

Referring to FIG. 2, in some embodiments, a system 200 including an SSD 200 may include a plurality of nand flash memory devices 202. One or more nand devices 202 may interface with a nand interface 204 that interacts with an SSD controller 206. The SSD controller 206 may receive read and write instructions from a host interface 208 implemented on or for a host device, such as a device including some or all of the attributes of the computing device 100. The host interface 208 may be a data bus, memory controller, or other components of an input/output system of a computing device.

The systems and methods disclosed herein may be implemented by an SSD controller 206 interposed between the host interface 208 and the nand interface 204. In other embodiments, the nand interface 204 may implement some or all of the functionality disclosed therein. In still other embodiments, an additional component may be interposed between a conventional nand interface 204 and SSD controller 206 in order to implement all or part of the functions disclosed herein.

In some embodiments, decoding and encoding of data may be performed by an encoding engine 210. Accordingly, in instances where data is transferred to a new location without re-encoding, as described below, the encoding engine 210 may be bypassed. Data decoding may be performed by a decoding engine 212. The decoding engine 212 may be implemented by the same or different circuits that implement the encoding engine 2120 or may share some of the same circuits implementing the decoding engine 212. In some embodiments, the decoding engine 212 will receive an encoded data and output both data recovered from the encoded data, corrected using parity data included in the encoded data, as well as error correction codes (ECC) or other parity data corresponding to the recovered data.

Figure 3A:
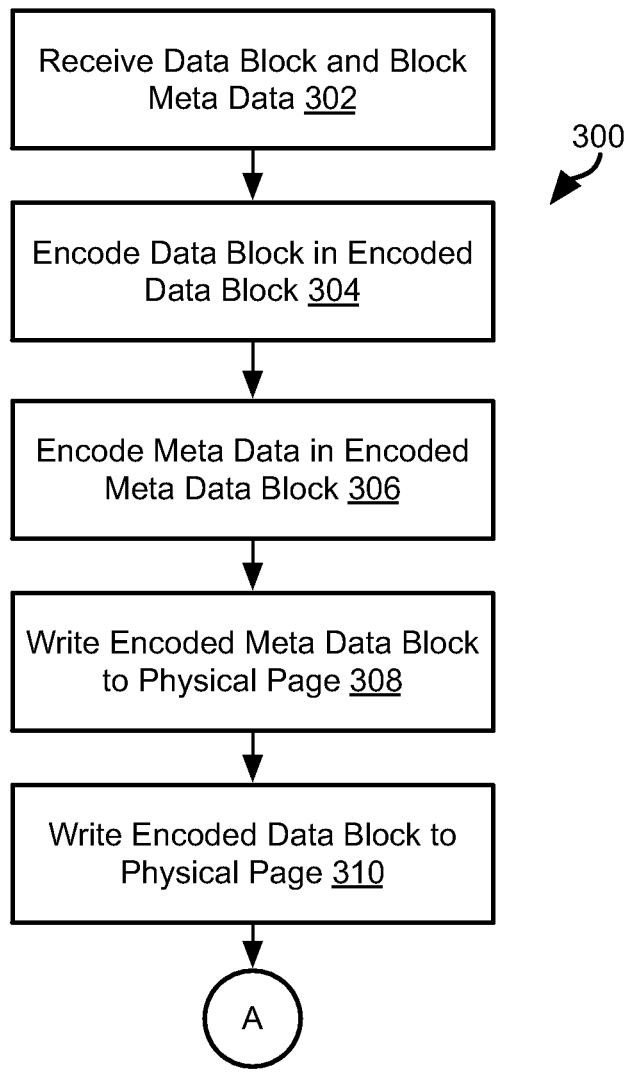
FIGS. 3A and 3B are a process flow diagram of a method for writing and moving data in accordance with an embodiment of the present invention.

Referring to FIG. 3A, the illustrated method 300 may be performed by the nand interface 204, SSD controller 206, or host interface 208 individually or in combination. The method 300 may include receiving 302 a data block and metadata for that data block. The data block may be an LBA as discussed in the Background section. The metadata may include information other than payload data for the data block that is used to access (e.g. decode or read) the data block or otherwise manage storage and access of the data block. In some embodiments, the data block and metadata may be one or more compressed data blocks and one or more headers describing the compressed data block, respectively, as described in U.S. application Ser. No. 14/173,586 filed Feb. 5, 2014 and entitled FLASH MEMORY COMPRESSION SYSTEM AND METHOD, which is hereby incorporated herein by reference in its entirety. In still other embodiments, the metadata may additionally or alternatively be data describing error correction or encryption of the data. Metadata may include information that is helpful to the system example, in case of power shutdown. Example contents of the metadata may include the LBA number, System Time Stamp, Data Block Related information like Error information etc. associated with the data block.

The metadata and datablock as received at step 302 may be encoded 304, 306 separately to generated an encoded data block and encoded metadata block. Encoding 304, 306 may include generating error correction codes (ECC), scrambling the data to avoid burn-in of the nand flash, or any other transformation. In some embodiments the encoding steps 304, 306 may be performed by the encoding engine 210. In particular, where the encoding is scrambling, the scrambling may be performed based exclusively on the storage locations of the data of the data block and metadata rather than attributes of the data block and metadata such as length or content of the data block and metadata. An example of such a data scrambling approach is described in U.S. application Ser. No. 14/456,997 filed Nov. 18, 2014, and entitled DATA RANDOMIZATION FOR FLASH MEMORY, which is hereby incorporated herein by reference in its entirety.

The method 300 may further include writing 308 the encoded metadata block to a physical page, such as a page referenced in an instruction received 302 with the data block and metadata or as a separate instruction referencing the data block and metadata received at step 302. Likewise, the encoded data block may be written 310 to that physical page.

Figure 3B:
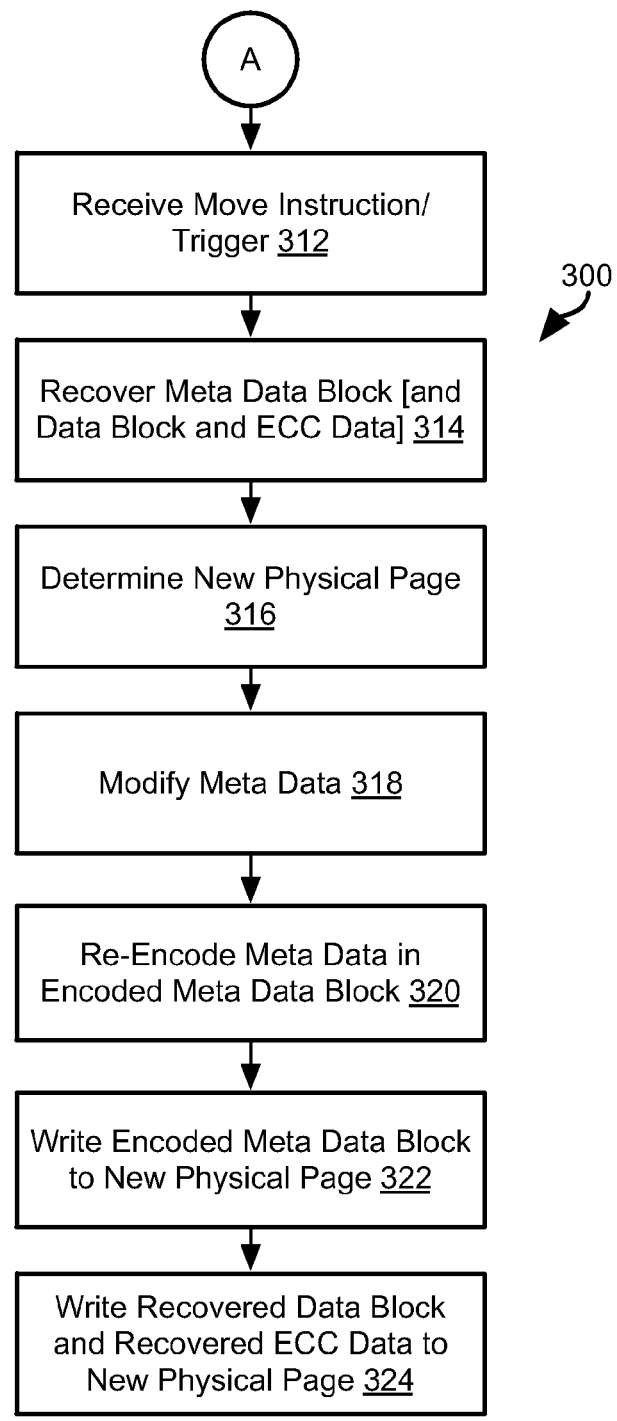

Referring to FIG. 3B, the method 300 may continue with steps 312-324 that may be invoked as part of a garbage collection process, de-fragmentation process, or any other context in which data is moved within a nand flash device or between nand flash devices.

For example, the method 30 may include receiving 312 a prompt to move the encoded metadata block and encoded data block, such as an instruction to move the encoded data block and metadata or detecting a triggering event that indicates that the data should be moved. In response to the instruction or trigger received at step 312, steps 314-324 may be performed. In particular, the encoded metadata block may be decoded 314, such as by the decoding engine 212, to obtain the original metadata block, i.e. any encoding performed at step 304 may be reversed or a corresponding decoding process performed that yields the original metadata prior to encoding at step 304. In some instances, the encoded data block is not decoded even though the encoded metadata block is decoded. In other instances, the encoded data block is decoded in order to perform error checking, but is not subsequently re-encoded. For example, the encoded data block may be input to the decoding engine 212, which will then output both recovered data and ECC data corresponding to the recovered data. The recovered data obtained by the decoding engine 212 by applying ECC data in the encoded data block to correct data errors according to the error correction scheme of the encoded data block.

The new location is determined at step 316, e.g. a new physical page, a new location within a new physical page, or a new location within the same physical page at which the encoded metadata block and encoded data block are stored. The new location may be determined from the received 312 instruction or by applying some selection criteria. The metadata as decoded at step 314 may be modified 318 according to the new physical page address and/or to reflect the fact that the metadata is being copied and rewritten. For Example the ECC information and the TimeStamp can be updated when the metadata is moved to the new location whereas the LBA number still stays the same.

The metadata as modified at step 318 may then be encoded 320 to obtain a new encoded metadata block and the new encoded data block is then written 322 to the new location determined at step 316. Encoding 320 may include performing the same encoding performed at step 304. The encoded data block is also written 324 to the new location determined at step 316.

The encoded data block encoded at step 304 is transferred to the new location without decoding and re-encoding the data block. This reduces processing power and time required to move the data block from one physical page to another or within the same physical page. In some instances the encoded data block may be decoded as part of an operation invoking the method 300. However, in such instances the data block may nonetheless not be re-encoded, but rather than encoded data block may be written to the new location without re-encoding being performed. For example, decoding may be performed in order to obtain the original data block for purposes of correcting errors in the encoded data block such as using error correction codes (ECC).

In some embodiments, the encoded data block is decoded in order to perform error correction using ECC data of the encoded data block. As noted above, decoding may be performed by the decoding engine 212, which outputs ECC data for the data recovered. Accordingly, an output of the step 304 may include both recovered data obtained from the encoded data block and ECC data for performing error correction on the recovered data. At step 324 the recovered data block is written to the new physical page along with the ECC data obtained at step 304. Writing of the recovered data and the ECC data may be performed in bypass of the encoding engine 210. Specifically, the recovered data is obtained by decoding the encoded data block but it is not encoded prior to being written to the new physical page. Accordingly, decoding and re-encoding of the data block is not performed.

The device executing the method 300 (nand interface 204, SSD controller 206, and/or host interface 208) may further perform read access operations with respect to the encoded metadata block and encoded data block either at the original storage location or the new storage location, herein after the current location. Upon receiving a read request, the executing device may retrieve the encoded metadata block and encoded data block form the current location, decode at least the encoded data block and returning it to the device that issued the read request. Again, decoding may be a reverse of the encoding steps described above or other process that extracts the data as constituted prior to encoding. In some embodiments both the metadata and a data block as decoded may be returned to the requestor. In others, only the data block is returned.

The present invention may be embodied in other specific forms without departing from its spirit or essential characteristics. The described embodiments are to be considered in all respects only as illustrative, and not restrictive. In particular, although the methods are described with respect to a nand flash SSD, other SSD devices or non-volatile storage devices such as hard disk drives may also benefit from the methods disclosed herein. The scope of the invention is, therefore, indicated by the appended claims, rather than by the foregoing description. All changes which come within the meaning and range of equivalency of the claims are to be embraced within their scope.

What is claimed is:

1. A method comprising:
   receiving, by storage device controller, a data block and metadata corresponding to the data block and describing the data block;
   encoding, by the storage device controller in an encoding engine, the metadata to obtain an encoded metadata block;
   encoding, by the storage device controller in an encoding engine, the data block separately from the metadata to obtain an encoded data block;
   writing, by the storage device controller, to a first storage region of a storage device, the encoded metadata block and encoded data block;
   detecting, by the storage device controller, a prompt to move the encoded metadata block and encoded data block;
   in response to detecting the prompt to move the encoded metadata block and encoded data block performing, by the storage device controller:
      decoding the encoded metadata block to obtain the metadata block;
      decoding the encoded data block to obtain a recovered data block and recovered error correction code (ECC) data, the recovered ECC data being parity data corresponding to the recovered data block;
      modifying the metadata block to obtain updated metadata;
      encoding the updated metadata in the encoding engine to obtain an encoded updated metadata block;
      writing the encoded updated metadata block to a second storage region of the storage device; and
      bypassing the encoding engine and writing the encoded recovered data block to the second storage region without re-encoding the recovered data block, the encoded recovered data block including both the recovered data block and the recovered ECC data.

2. The method of claim 1, wherein the prompt to move the encoded metadata block and encoded data block encode meta comprises an instruction to move the encoded metadata block and encoded data block during performing garbage collection by the storage device controller.

3. The method of claim 1, wherein the prompt to move the encoded metadata block and encoded data block encode meta comprises an instruction to move the encoded metadata block and encoded data block during performing defragmentation by the storage device controller.

4. The method of claim 1, wherein the storage device is a solid state drive (SSD).

5. The method of claim 4, wherein the SSD includes a nand flash device.

6. The method of claim 1, wherein encoding the metadata and encoding the data block include performing compression of the metadata and data block.

7. The method of claim 1, wherein encoding the metadata and encoding the data block include generating error correction codes for the metadata and data block.

8. The method of claim 1, wherein the storage device controller is coupled to a host device.

9. The method of claim 8, further comprising:
   receiving, by the storage device controller, a read instruction from the host device;
   in response to receiving the read instruction, performing by the storage device controller—
      reading the encoded data block from the second storage region of the storage device;
      decoding the encoded data block to obtain the data block; and
      returning the data block to the host device.

10. The method of claim 8, wherein detecting the prompt to move the encoded metadata block and encoded data block comprises receiving an instruction from the host device.

11. An apparatus comprising:
    a host computing device including one or more processors;
    a storage device including a non-volatile storage medium defining a plurality of pages each having a plurality of column addresses; and
    a memory controller device operably coupled to the host computing device and the storage device, the memory controller device configured to:
       receive a data block and metadata corresponding to the data block and describing the data block;
       encode the metadata in an encoding engine to obtain an encoded metadata block;
       encode the data block in the encoding engine separately from the metadata to obtain an encoded data block;
       write to a first storage region of the storage device, the encoded metadata block and encoded data block;
       detect a prompt to move the encoded metadata block and encoded data block;
       in response to detecting the prompt to move the encoded metadata block and encoded data block—
          decode the encoded metadata block to obtain the metadata block;
          decode the encoded data block to obtain a recovered data block and recovered error correction code (ECC) data, the recovered ECC data being parity data corresponding to the recovered data block;
          modify the metadata block to obtain updated metadata;
          encode the updated metadata in the encoding engine to obtain an encoded updated metadata block;
          write the encoded updated metadata block to a second storage region of the storage device; and
          bypass the encoding engine and writing the encoded recovered data block to the second storage region without re-encoding the recovered data block, the encoded recovered data block including both the recovered data block and the recovered ECC data.

12. The apparatus of claim 11, wherein the prompt to move the encoded metadata block and encoded data block encode meta comprises an instruction to move the encoded metadata block and encoded data block during performing garbage collection by the storage device controller.

13. The apparatus of claim 11, wherein the prompt to move the encoded metadata block and encoded data block encode meta comprises an instruction to move the encoded metadata block and encoded data block during performing defragmentation by the storage device controller.

14. The apparatus of claim 11, wherein the storage device is a solid state drive (SSD).

15. The apparatus of claim 14, wherein the SSD includes a nand flash device.

16. The apparatus of claim 11, wherein the storage device is a hard disc drive.

17. The apparatus of claim 11, wherein the memory controller device is further configured to encode the metadata and encode the data block by performing compression of the metadata and data block.

18. The apparatus of claim 11, wherein the memory controller device is further configured to encode the metadata and encode the data block by generating error correction codes for the metadata and data block.

19. The apparatus of claim 11, wherein the memory controller device is further configured to:
   receive a read instruction from the host device;
   in response to receiving the read instruction—
      read the encoded data block from the second storage region of the storage device;
      decode the encoded data block to obtain the data block; and
      return the data block to the host device.

20. The apparatus of claim 11, wherein the host device is configured to generate the prompt to move the encoded metadata block and encoded data block comprises.

* * * * *